United States Patent
Watanabe et al.

(10) Patent No.: US 10,553,566 B2
(45) Date of Patent: Feb. 4, 2020

(54) STACKED SEMICONDUCTOR DIE ASSEMBLIES WITH DIE SUBSTRATE EXTENSIONS

(71) Applicant: Micron Technology, Inc., Boise, ID (US)

(72) Inventors: Fumitomo Watanabe, Akita (JP); Keiyo Kusanagi, Akita (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/154,659

(22) Filed: Oct. 8, 2018

(65) Prior Publication Data

US 2019/0043840 A1 Feb. 7, 2019

Related U.S. Application Data

(62) Division of application No. 15/438,691, filed on Feb. 21, 2017, now Pat. No. 10,147,705.

(51) Int. Cl.
| | |
|---|---|
| *H01L 21/00* | (2006.01) |
| *H01L 25/065* | (2006.01) |
| *H01L 23/31* | (2006.01) |
| *H01L 23/29* | (2006.01) |
| *H01L 25/00* | (2006.01) |

(Continued)

(52) U.S. Cl.
CPC .......... *H01L 25/0657* (2013.01); *H01L 21/52* (2013.01); *H01L 21/565* (2013.01); *H01L 21/568* (2013.01); *H01L 23/293* (2013.01); *H01L 23/3107* (2013.01); *H01L 25/50* (2013.01); *H01L 2225/0651* (2013.01); *H01L 2225/06582* (2013.01)

(58) Field of Classification Search
CPC ....... H01L 222/32145; H01L 2924/181; H01L 25/0657; H01L 2224/16145; H01L 21/6835
USPC ........ 438/106, 107, 108, 109, 110, 118, 127
See application file for complete search history.

(56) References Cited

U.S. PATENT DOCUMENTS

| | | |
|---|---|---|
| 8,772,084 B2 | 7/2014 | Lee et al. |
| 8,786,102 B2 | 7/2014 | Yoshida et al. |

(Continued)

FOREIGN PATENT DOCUMENTS

JP  2005303267 A  10/2005

OTHER PUBLICATIONS

"International Search Report and Written Opinion dated May 23, 2018 in International Application No. PCT/US2018/018805, 14 pages."

(Continued)

*Primary Examiner* — S. V. Clark
(74) *Attorney, Agent, or Firm* — Perkins Coie LLP (57) ABSTRACT

Stacked semiconductor die assemblies with die substrate extensions are disclosed herein. In one embodiment, a semiconductor die assembly can include a package substrate, a first die mounted to the package substrate, and a second die mounted to the first die. The first die includes a first die substrate, and the second die includes a second die substrate attached to the first die substrate. At least one of the first and second dies includes a semiconductor substrate and a die substrate extension adjacent the semiconductor substrate. The die substrate extension comprises a mold material that at least partially defines a planform.

14 Claims, 5 Drawing Sheets

(51) Int. Cl.
*H01L 21/56* (2006.01)
*H01L 21/52* (2006.01)

(56) References Cited

U.S. PATENT DOCUMENTS

| | | |
|---|---|---|
| 2009/0321907 A1 | 12/2009 | Lee et al. |
| 2011/0031600 A1 | 2/2011 | Kim |
| 2011/0079890 A1 | 4/2011 | Song et al. |
| 2013/0049228 A1 | 2/2013 | Nam et al. |
| 2013/0147062 A1* | 6/2013 | Lee .................. H01L 24/49 257/777 |
| 2013/0270717 A1* | 10/2013 | Ko .................. H01L 25/105 257/777 |
| 2014/0070428 A1* | 3/2014 | Tanimoto .......... H01L 23/488 257/777 |
| 2015/0061157 A1 | 3/2015 | Yu et al. |
| 2015/0069632 A1 | 3/2015 | Ozawa |
| 2015/0102507 A1* | 4/2015 | Lee .................. H01L 25/0657 257/777 |
| 2015/0214193 A1 | 7/2015 | Yoshimura et al. |
| 2015/0311185 A1* | 10/2015 | Ng .................. H01L 25/18 257/784 |
| 2015/0311186 A1* | 10/2015 | Ye .................. H01L 25/18 257/777 |
| 2016/0042998 A1 | 2/2016 | Pueschner et al. |
| 2018/0240782 A1 | 8/2018 | Watanabe et al. |

OTHER PUBLICATIONS

TW Patent Application No. 107104875—Taiwanese Office Action and Search Report, dated Nov. 9, 2018, with English Translation, 15 pages.

* cited by examiner

STACKED SEMICONDUCTOR DIE ASSEMBLIES WITH DIE SUBSTRATE EXTENSIONS

CROSS-REFERENCE TO RELATED APPLICATIONS

This application is a division of U.S. application Ser. No. 15/438,691, filed Feb. 21, 2017, which is incorporated herein by reference in its entirety.

TECHNICAL FIELD

The disclosed embodiments relate to semiconductor die assemblies and to die substrate extensions in such assemblies.

BACKGROUND

Packaged semiconductor dies, including memory chips, microprocessor chips, and imager chips, can include semiconductor dies mounted on a package substrate. The semiconductor dies are encased in a plastic protective covering, and each die includes functional features, such as memory cells, processor circuits, and imager devices. Bond pads on the dies are electrically connected between the functional features and terminals on the package substrate that allow the dies to be connected to external circuitry.

To increase the density of dies within a package, the dies can be stacked upon one another within the casing. One challenge with vertically stacked dies, however, is that the dies can have different sizes or footprints. For example, in a memory package, a memory controller die can have a smaller footprint than the memory dies within the package. The memory controller die can be more difficult to wirebond because it is offset from the memory dies. Also, the memory dies can sometimes tilt when stacked upon the smaller memory controller die, which can lead to wires becoming unbonded and/or to chip cracking.

DETAILED DESCRIPTION

Embodiments of stacked die assemblies having die substrate extensions are described below. In some embodiments, a stacked die assembly includes a semiconductor die and a mold material that together form a die substrate or similar support structure upon which additional dies of an assembly can be stacked. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form.

As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
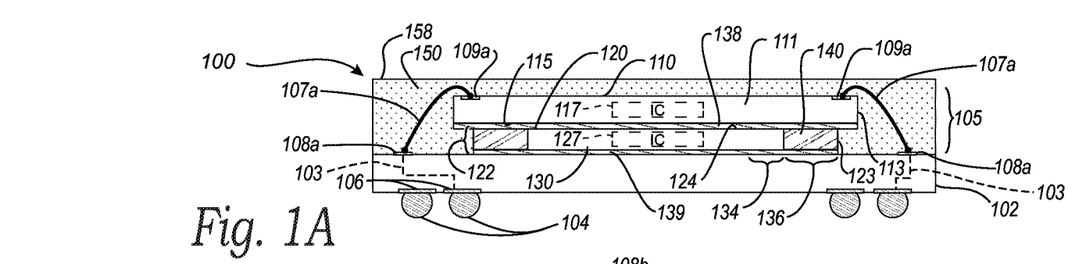
FIG. 1A is a cross-sectional view of a semiconductor die assembly configured in accordance with an embodiment of the present technology.
Figure 1B:
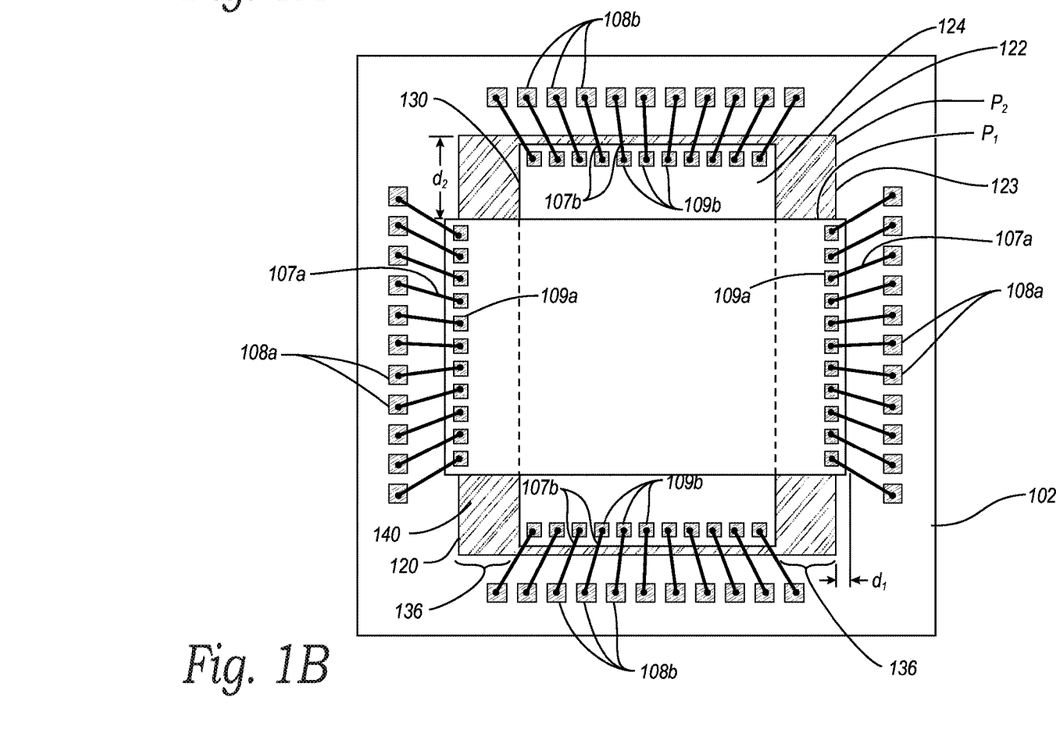
FIG. 1B is a top plan view of a portion of the semiconductor die assembly.

FIG. 1A is a cross-sectional view, and FIG. 1B is a top plan view, of a semiconductor die assembly 100 ("assembly 100") configured in accordance with an embodiment of the present technology. Referring to FIG. 1A, the assembly 100 includes a package substrate 102 (e.g., a printed circuit board) carrying a first die 110 and a second die 120, wherein the first die 110 is stacked on the second die 120 (collectively "die stack 105"). The first die 110 can be, for example, a semiconductor die having a first die substrate 111 (e.g., a semiconductor substrate) with a first outer edge 113. The second die 120 includes a semiconductor substrate 130 (e.g., a silicon substrate) having a peripheral portion 134 and a substrate extension 136 ("substrate extension 136") that extends from the peripheral portion 134 to a second outer edge 123 of the second die 120. The second outer edge 123 of the second die 120 is inset from the first outer edge 113 of the first die 110 (e.g., inboard of the first outer edge 113). In various embodiments described below, the substrate extension 136 can be formed from a first mold material 140, such as a thermoset material, an epoxy resin, or other suitable compound. The first mold material 140 and the semiconductor substrate 130 form a second die substrate 122 of the second die 120.

The assembly 100 further includes a second mold material 150 (e.g., an epoxy) over the package substrate 102 and encapsulating the die stack 105 to form a protective casing 158. The casing 158 can be configured to provide a mechanical support and a shield from the ambient environment (e.g., from humidity). The casing 158 also maintains electrical isolation between wire bonds. In some embodiments, the second mold material 150 of the casing 158 can be the same as or substantially similar to the first mold material 140 of the second die substrate 122.

Referring to FIG. 1B, the casing 158 (FIG. 1A) of the assembly 100 has been removed to show the first die 110, the second die 120 and other components of the assembly 100 in further detail. The first die substrate 111 (FIG. 1A) defines a first footprint, or first perimeter $P_1$, of the first die 110 above the second die 120. The second die substrate 122 defines a second footprint, or second perimeter $P_2$, of the second die 120, with the first mold material 140 of the die substrate 122 at least partially defining a planform. The first and second perimeters $P_1$ and $P_2$ overlap one another such that a region of the first outer edge 113 of the first die substrate 111 overhangs a portion of the package substrate 102 by a first distance $d_1$, and such that a region of the second outer edge 123 of the second die substrate 122 extends a second distance $d_2$ beyond the first outer edge 113. In the embodiment illustrated in FIG. 1B, the region of the second outer edge 123 that extends the second distance $d_2$ includes a portion of the first mold material 140 and a portion of the semiconductor substrate 130 of the second die 120.

In use, the substrate extension 136 can stabilize the overhanging edge 113 of the first die 110. In various embodiments, the substrate extension 136 can stabilize not only the first die 110 but any additional dies (not shown) stacked on the first die 110. The stacked arrangement of dies reduces the overall size of the assembly 100 because all of the dies are positioned within the common footprint of the die stack. Additionally, the thickness of first die 110 can be reduced because the overhanging portion of the first die 110 is supported by the substrate extension 136 of the second die 120. In some embodiments, the first die 110 can be a memory die and the second die 120 can be a controller die. A memory die can include integrated circuit components 117 (shown schematically) configured to form a memory circuit. A controller die typically has a more compact and/or smaller arrangement of integrated circuit components 127 (shown schematically). As a result, a controller die typically has a smaller footprint than a memory die. One challenge with stacking a larger memory die on a smaller controller die is that the larger memory die can cant or tilt if it is not aligned properly when it is stacked on the controller die. In some instances, a tilted die can project outside of the protective casing and expose a portion of the die to the ambient environment. Tilted dies are generally more prone chip cracking and wirebonding to a tilted die can be more difficult because the wire bonds have different lengths at the opposite sides of the die. One conventional manufacturing technique to address this challenge involves forming a cavity in the package substrate into which the lower die can be inserted. This technique, however, can complicate manufacturing and increase costs because it requires the package substrate to be milled or etched to form the cavity. Another existing solution is to mount spacers or supports to the package substrate 102.

Die assemblies configured in accordance with various embodiments of the present technology can address these and other limitations of conventional stacked die assemblies. For example, in some embodiments the substrate extension 136 of the lower second die 120 can extend the perimeter of the second die substrate 122 to match a size and/or shape of the first die 110. The increased size of the second die 120 can provide additional support to the first die 110, which, in turn, reduces or prevents die tilt. In various embodiments, the substrate extension 136 can be configured such that a lesser amount or no amount of the first die 110 overhangs the package substrate 102. In some embodiments, other dies of a semiconductor die assembly can include a substrate extension, or multiple dies in a die stack can include a substrate extension to enhance mechanical support in the stack. In these embodiments and others, die assemblies that include dies having substrate extensions can accommodate dies and corresponding semiconductor substrates having staggered arrangements, overlapping orientations, and/or disparate shapes.

Referring back to FIG. 1A, the package substrate 102 includes a plurality of first substrate pads 108a coupled to corresponding bond pads 109a on the first die 110 by first wire bond connectors 107a (e.g., wirebonds). Referring to FIG. 1B, the first substrate pads 108a are arrayed along opposite sides of the second perimeter $P_2$ of the second die 120. The package substrate 102 further includes second substrate pads 108b positioned on opposite sides of the second perimeter $P_2$ and arrayed in a direction that is generally perpendicular to the arrays of first substrate pads 108a. The second substrate pads 108b are coupled to corresponding bond pads 109b on an upper surface 124 of the semiconductor substrate 130 of the second die 120 by second wire bond connectors 107b (e.g., wirebonds). The bond pads 109a can be generally aligned with the first mold material 140, which can help increase the reliability of the wire bonding and prevent chip cracking.

As further shown in FIG. 1A, the package substrate 102 can include electrical connectors 103 (shown schematically), such as metal traces, vias, or other suitable connectors (forming, e.g., redistribution structures) on opposite sides of the package substrate 102 and/or extending through the package substrate 102. The electrical connectors 103 can couple the first substrate pads 108a and/or the second substrate pads 108b (FIG. 1B) to external circuitry (not shown) via package contacts 106 and interconnects 104 (e.g., bump bonds) at the opposite side of the package substrate 102. In some embodiments, the electrical connectors 103 can also couple individual first substrate pads 108a with individual second substrate pads 108b to electrically intercouple the first and second dies 110 and 120.

The first die 110 further includes a lower surface 115 that is attached to the second die 120 by a first die-attach material 138 (e.g., a die-attach film). In the embodiment illustrated in FIG. 1A, the first die-attach material 138 includes a first portion that is attached to the substrate extension 136 of the second die 120, and a second portion that is attached to the upper surface 124 of the semiconductor substrate 130 of the second die 120. In other embodiments, the first die-attach material 138 is attached to the semiconductor substrate 130, but not attached to the substrate extension 136 (or vice versa).

The second die 120 is attached to the package substrate 102 by a second die-attach material 139 (e.g., a die-attach film). In some embodiments, the die-attach materials 138 and 139 can be formed from the same or similar materials. In these and other embodiments, one or more of the die-attach materials 138 and 139 can include an over wire material or a laminate film (e.g., a laminate film of epoxy-based material). In some embodiments, the die-attach materials can include, for example, a die-attach film or a dicing-die-attach film (known to those skilled in the art as "DAFs" or "DDFs," respectively). In one embodiment the die-attach materials and/or film-over wire materials can each include DAFs or DDFs provided by Henkel AG & Co. of Shangai, China (e.g., Model Nos. Ablestick ATB-100, 100U, 100A, 100U).

The semiconductor substrates of each of the first and second dies 110 and 120 can be formed from any of a variety of semiconductor materials, such as silicon, silicon-on-insulator, compound semiconductor (e.g., Gallium Nitride), or other suitable substrate. The semiconductor substrates can be cut or singulated into semiconductor dies having any of variety of integrated circuit components (shown schematically), such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a memory in which one or both of the dies 110 and 120 provide data storage (e.g., NAND dies) and/or memory control (e.g., NAND control). In various embodiments, the assembly 100 can include additional dies, such as additional dies stacked upon the first die 110. In some embodiments, instead of two memory dies, the assembly 100 can include more than two memory dies (e.g., four dies, eight dies, etc.) or only a single memory die. Further, in various embodiments, the dies of the assembly 100 can have different sizes. For example, in some embodiments the entire first perimeter $P_1$ of the first die 110 can be outside of the entire second perimeter $P_2$ of the second die 120.

Figure 2A:
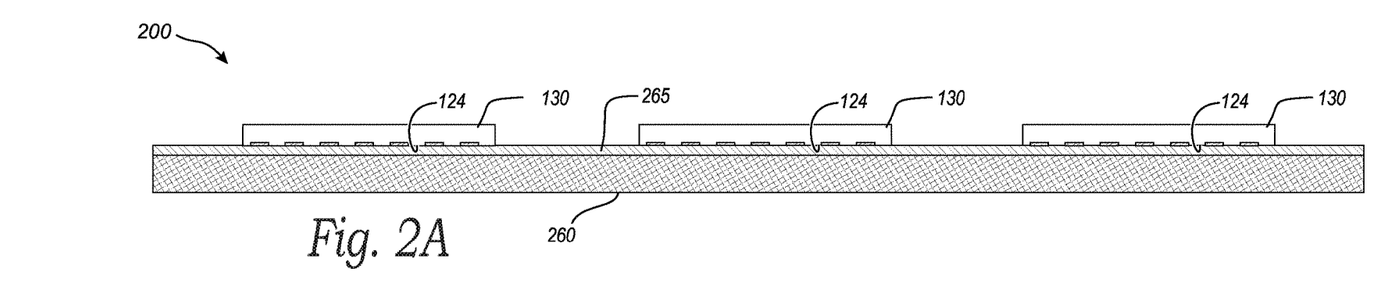
FIGS. 2A-2F are cross-sectional views illustrating a semiconductor device at various stages of manufacturing a semiconductor die assembly in accordance with embodiments of the present technology.

FIGS. 2A-2F are cross-sectional views illustrating a semiconductor device 200 at various stages of manufacture in accordance with embodiments of the present technology. Referring first to FIG. 2A, the upper surface 124 of a plurality of the semiconductor substrates 130 of a plurality of second dies 120 are attached to a temporary carrier 260 by an adhesive 265. The temporary carrier 260 can be made of an inexpensive material, such as silicon or a carrier tape, that can be reused and/or recycled.

Figure 2B:
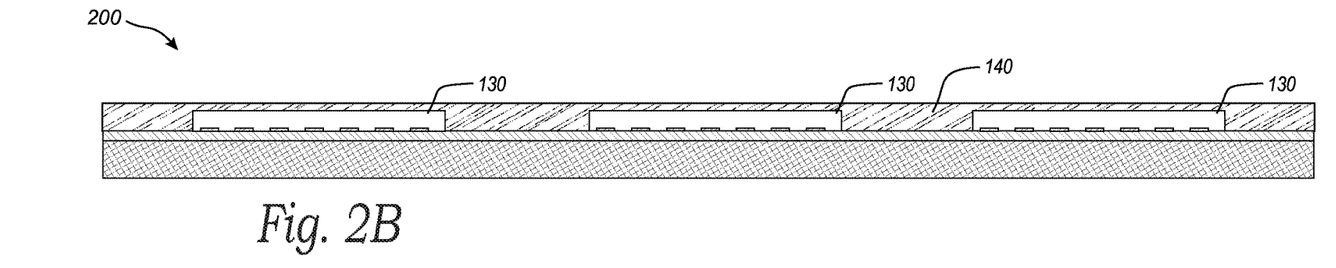
Figure 2C:
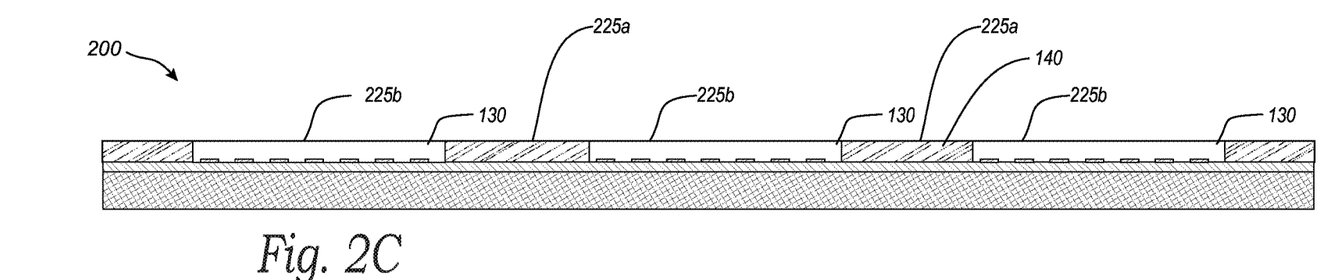

FIG. 2B shows the semiconductor device 200 after encapsulating the semiconductor substrates 130 with the first mold material 140. In various embodiments, the semiconductor substrates 130 can be received into a mold cavity (not shown) of a molding apparatus. The first mold material 140 can be heated and compressed in the cavity such that the first mold material 140 liquefies and flows over the semiconductor substrates 130. The first mold material 140 can then be allowed to cool and harden. Once hardened, the first mold material 140 can be thinned (e.g., via backgrinding) to define first outer surfaces 225a on the first mold material 140, as shown in FIG. 2C. Thinning the first mold material 140 also exposes second outer surfaces 225b (e.g., back-side surfaces) of the corresponding semiconductor substrates 130. The first mold material 140 and the semiconductor substrates 130 can be substantially coplanar after thinning.

Figure 2D:
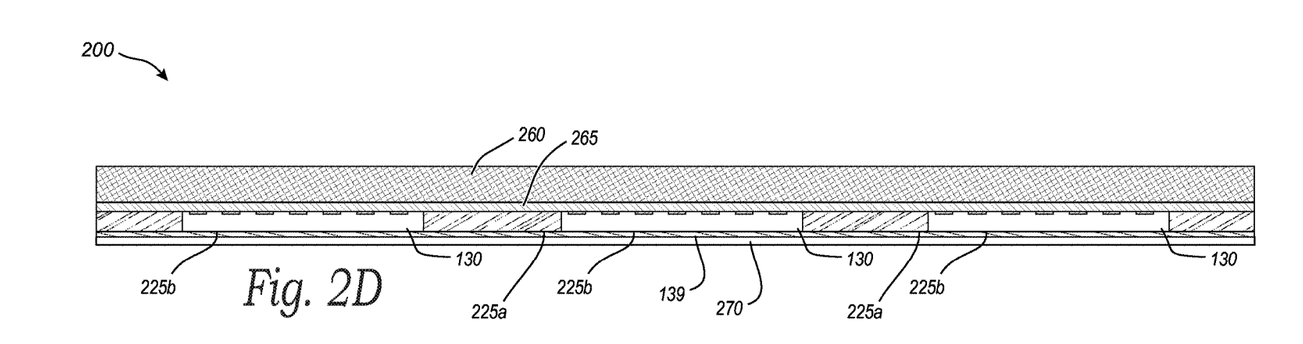

FIG. 2D shows the semiconductor device 200 in an inverted orientation after the second die-attach material 139 has been formed over the outer surfaces 225a and 225b of the first mold material 140 and the semiconductor substrates 130, and after a transfer structure 270 has been formed over the second die-attach material 139. The transfer structure 270 can include, for example, a die-attach tape. In some embodiments, the temporary carrier 260 and the adhesive 265 can be removed after forming the transfer structure 270, as shown in FIG. 2E.

Figure 2E:
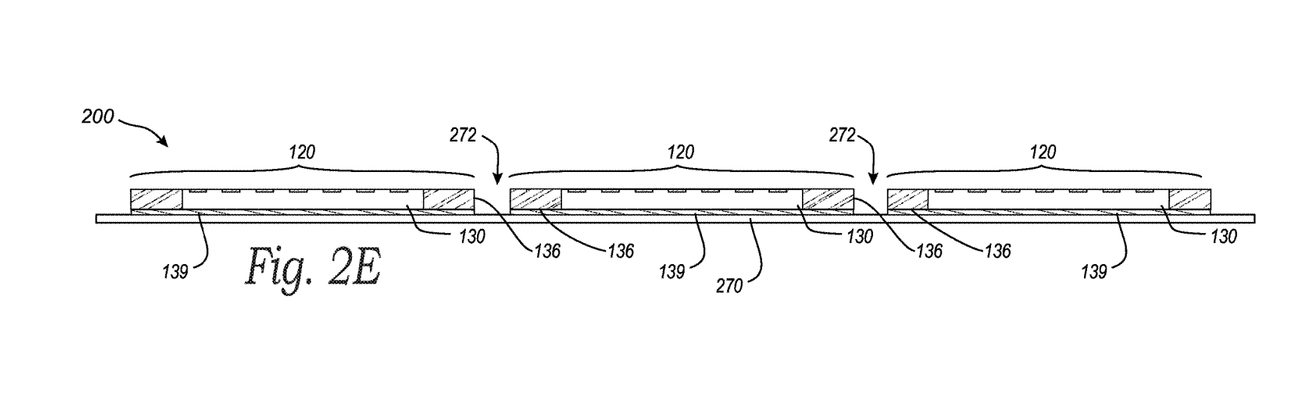

FIG. 2E shows the semiconductor device 200 after singulation of the second dies 120. During singulation, the first mold material 140 can be cut together with the second die-attach material 139 at dicing lanes 272. The singulation defines the substrate extensions 136 of the second dies 120. Singulation can include blade-, saw-, or laser-cutting processes as well as other suitable processes for defining and mechanically separating the substrate extensions 136. In some embodiments, the second dies 120 can be singulated such that the first mold material 140 completely surrounds the corresponding semiconductor substrates 130. In other embodiments, the second dies 220 can be singulated such that the mold material extends around fewer than all the edges of a die.

Figure 2F:
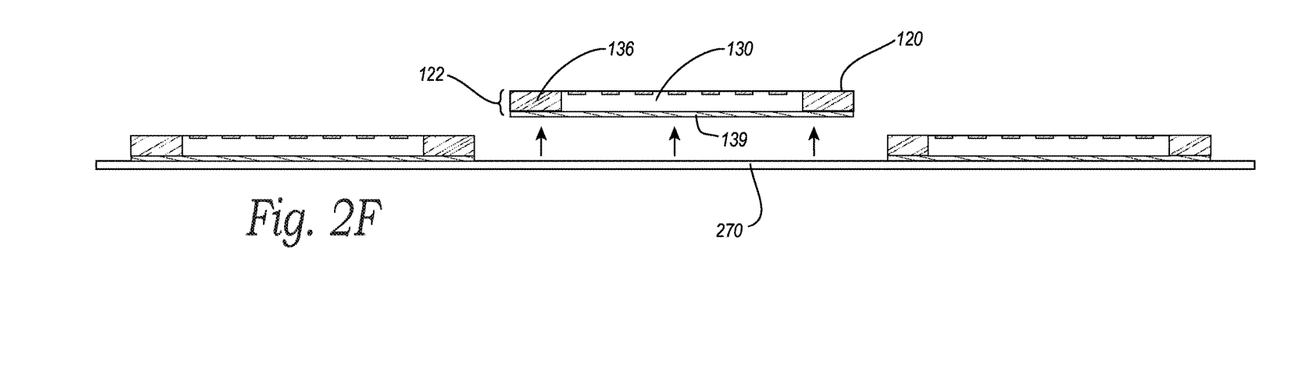

In some embodiments, the second dies 120 can remain on the transfer structure 270 during subsequent processing stages to facilitate device handling. Manufacturing of the singulated second dies 120 can continue to other manufacturing stages, such as device testing or assembly. Referring to FIG. 2F, the second dies 120 can be removed from the transfer structure 270 (only one shown), with the singulated die-attach material 139 remaining on the detached second die 120. The second die 120 includes the semiconductor substrate 130 and the substrate extension 136, which together form the second die substrate 122. The singulated die-attach material 139 can be used to attach the second die 120 to the package substrate 102 (FIG. 1A). The second die 120 can be attached to the first die 110 (FIG. 1A) by the first die-attach material 138 (FIG. 1A) to form a die stack 105. An encapsulant (not shown), such as the second mold material 150 (FIG. 1A), can be flowed over the die stack and the package substrate 102 to encase the dies 110 and 120 after wirebonding, as described above.

Figure 3:
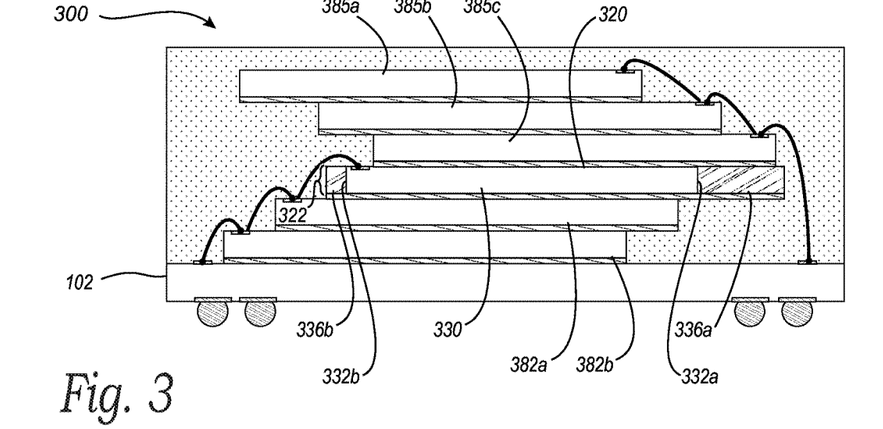
FIG. 3 is a cross-sectional view of a semiconductor die assembly configured in accordance with another embodiment of the present technology.

FIG. 3 is a cross-sectional view of a semiconductor die assembly 300 ("assembly 300") configured in accordance with another embodiment of the present technology. The assembly 300 can include features generally similar to those of the assembly 100 described in detail above. For example, the assembly 300 includes an intermediary die 320 having a die substrate 322 formed from a semiconductor substrate 330 and a substrate extension. In the example illustrated in FIG. 3, the substrate extension includes first and second extension portions 336a and 336b adjacent opposing edges 332a and 332b, respectively, of the semiconductor substrate 330.

As further shown in FIG. 3, the assembly 300 includes a stack of lower dies 382a and 382b (collectively "lower die stack 382") mounted to the package substrate 102. The intermediary die 320 is attached to the uppermost die 382a of the lower die stack 382. The lower dies 382a and 382b are staggered such that the uppermost die 382a overhangs a portion of the package substrate 102, and a portion of the intermediary die 320 extends beyond the perimeter of the uppermost die 382a.

The assembly 300 further includes a stack of upper dies 385a-c (collectively "upper die stack 385") carried by the intermediary die 320. The upper die stack 385 partially overhangs the package substrate 102, and is staggered in a manner similar to the lower die stack 382, but in an opposite direction. The first extension portion 336a overhangs the package substrate 102 and projects from the first edge 332a of the semiconductor substrate 330 beneath a lowermost die 385c of the upper die stack 385. The first extension portion 336a can support the overhanging upper die stack 385 to prevent or reduce canting or tilting of the stack in a manner similar to that described above.

The second extension portion 336b extends from the second edge 332b of the semiconductor substrate 330 and over an adjacent portion of the uppermost die 382a of the lower die stack 382. In various embodiments, the second extension portion 336b can increase the size of the mounting surface of the intermediary die 320 to facilitate attachment to the lower die stack 382. In the embodiment illustrated in FIG. 3, the second extension portion 336b has a smaller profile than the first extension portion 336a. In other embodiments, the second extension portion 336b can be larger than the first extension portion 336a, or the second extension portion 336b can have the same shape and/or size as the first extension portion 336a. In some embodiments, the second extension portion 336b can be omitted.

Figure 4:
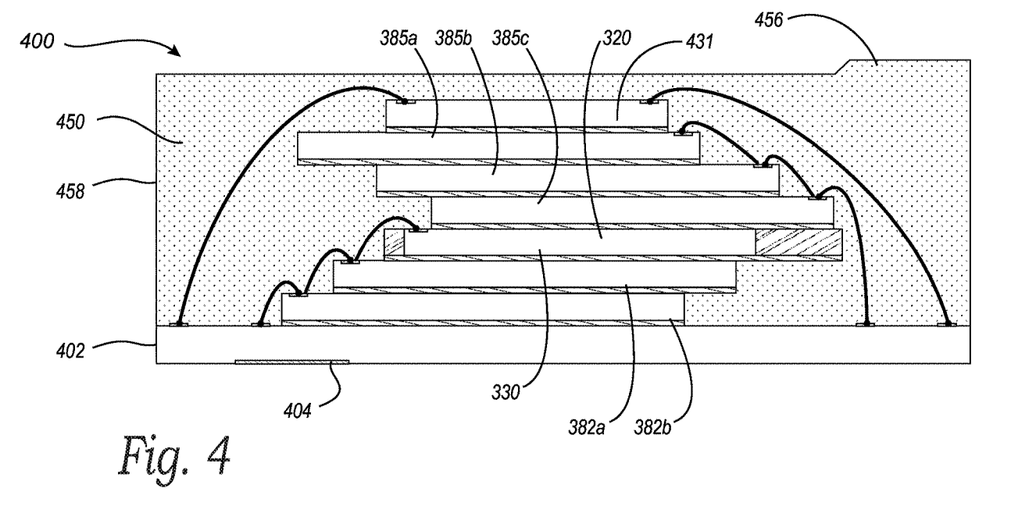
FIG. 4 is a cross-sectional view of a semiconductor die assembly configured in accordance with another embodiment of the present technology.

FIG. 4 is a cross-sectional view of a semiconductor die assembly 400 ("assembly 400") configured in accordance with another embodiment of the present technology. The assembly 400 can include features generally similar to those of the die assemblies described in detail above. For example, the assembly 400 includes the lower die stack 382, the intermediary die 320 mounted to the lower die stack 382, and the upper die stack 385 mounted to the intermediary die 320. In the arrangement shown in FIG. 4, the assembly 400 includes a controller die 431 carried by the upper die stack 385. In some embodiments, the intermediary die 320 and the lower and upper die stacks 382 and 385 can include memory dies. In these and other embodiments, the assembly 400 can be configured as a memory card. For example, the assembly 400 can include a housing 458 and a package substrate 402 that can be received into a memory slot (not shown) of a host device (not shown). The housing 458 can be formed from a mold material 450 that encases the dies of the assembly 400. The mold material 450 can be shaped to define an exterior projection, or hooking tab 456, that abuts the memory slot when installed in the host device. The package substrate 402 can include external terminals 404 (only one terminal is visible in FIG. 4) electrically connected to the dies within the housing 458.

Figure 5:
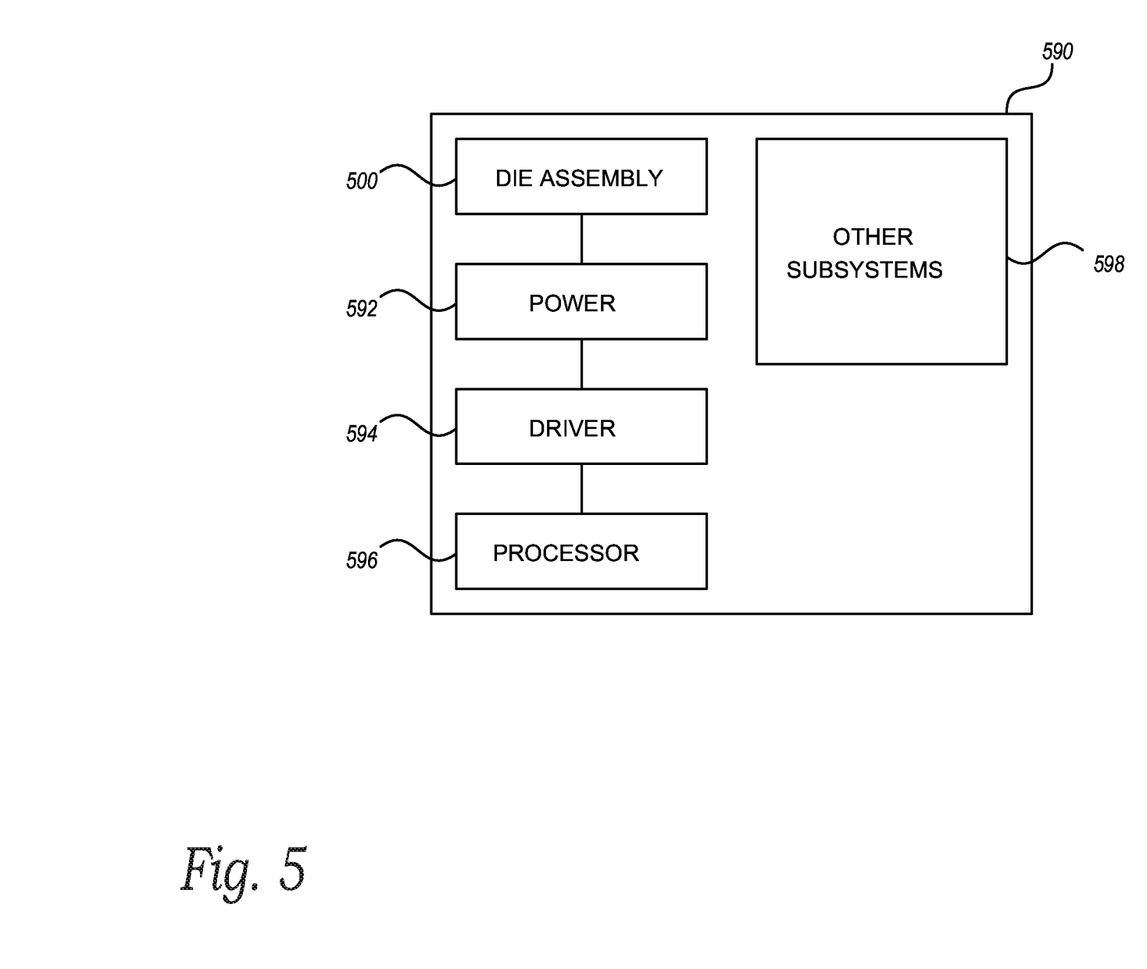
FIG. 5 is a schematic view of a system that includes a semiconductor die assembly configured in accordance with embodiments of the present technology.

Any one of the stacked semiconductor die assemblies described above with reference to FIGS. 1-4 can be incorporated into any of a myriad of larger and/or more complex systems, a representative example of which is system 590 shown schematically in FIG. 5. The system 590 can include a semiconductor die assembly 500, a power source 592, a driver 594, a processor 596, and/or other subsystems or components 598. The semiconductor die assembly 500 can include features generally similar to those of the stacked semiconductor die assemblies described above. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, and appliances. Components of the system 590 may be housed in a single unit or distributed over multiple, interconnected units (e.g., through a communications network). The components of the system 590 can also include remote devices and any of a wide variety of computer readable media.

From the foregoing, it will be appreciated that specific embodiments of the technology have been described herein for purposes of illustration, but that various modifications may be made without deviating from the disclosure. Also, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method of manufacturing a semiconductor device, the method comprising:
    forming a mold material around a portion of a parameter of a semiconductor substrate, wherein the mold material extends outwardly from the portion of the semiconductor substrate and defines a planform of a first die;
    attaching a second die to the first die to form a die stack, wherein attaching the second die includes attaching the second die to the semiconductor substrate and the mold material; and
    mounting the die stack to a package substrate, wherein the second die is between the package substrate and the first die, and wherein the mold material of the first die extends beyond the second die and overhangs the package substrate.

2. The method of claim 1 wherein the mounting includes attaching the package substrate to both the semiconductor substrate and the mold material of the first die.

3. The method of claim 1 wherein the mounting includes attaching the second die to the package substrate.

4. The method of claim 3 wherein the mold material is a first mold material, and wherein the method further comprises molding a second mold material over the first mold material to form a package casing.

5. The method of claim 1 wherein the molding includes:
    attaching the semiconductor substrate of the first die to a temporary carrier;
    molding the mold material over the semiconductor substrate and the temporary carrier; and
    thinning the mold material to expose a first surface of the semiconductor substrate and a second surface of the mold material, wherein the first surface is adjacent the second surface.

6. The method of claim 5, further comprising attaching the package substrate to the first and second surfaces.

7. The method of claim 5, further comprising attaching the second die to the first and second surfaces.

8. The method of claim 5, further comprising flowing an encapsulant over the package substrate and the die stack after the molding.

9. The method of claim 1 wherein at least one of the first and second dies is a memory die.

10. The method of claim 9 wherein the semiconductor substrate of the first die includes a controller circuit.

11. The method of claim 1 wherein the first die defines a first perimeter, and wherein the second die defines a second perimeter, and wherein the first and second perimeters overlap each other.

12. The method of claim 11 wherein the first die has a first outer edge, and wherein the first and second perimeters overlap each other such that a region of the first outer edge overhangs a portion of the package substrate.

13. The method of claim 12 wherein the region of the first outer edge overhangs the portion of the package substrate by a first distance.

14. The method of claim 13 wherein the second die has a second outer edge, and wherein the first and second perimeters overlap each other such that a region of the second outer edge extends a second distance beyond the first outer edge.

* * * * *